United States Patent
Kawahara

(10) Patent No.: US 10,722,948 B2
(45) Date of Patent: Jul. 28, 2020

(54) COATED CUTTING TOOL

(71) Applicant: TUNGALOY CORPORATION, Fukushima (JP)

(72) Inventor: Keiya Kawahara, Iwaki (JP)

(73) Assignee: TUNAGLOY CORPORATION, Iwaki-shi, Fukushima (JP)

(*) Notice: Subject to any disclaimer, the term of this patent is extended or adjusted under 35 U.S.C. 154(b) by 118 days.

(21) Appl. No.: 15/957,314

(22) Filed: Apr. 19, 2018

(65) Prior Publication Data
US 2018/0304376 A1  Oct. 25, 2018

(30) Foreign Application Priority Data

Apr. 21, 2017 (JP) .................................. 2017-084073

(51) Int. Cl.

| | | |
|---|---|---|
| B23B 27/14 | (2006.01) | |
| C23C 16/36 | (2006.01) | |
| C23C 16/40 | (2006.01) | |
| C23C 16/34 | (2006.01) | |
| C23C 28/04 | (2006.01) | |
| C23C 14/12 | (2006.01) | |
| C23C 16/56 | (2006.01) | |
| C23C 30/00 | (2006.01) | |

(52) U.S. Cl.
CPC ............ *B23B 27/148* (2013.01); *C23C 14/12* (2013.01); *C23C 16/34* (2013.01); *C23C 16/36* (2013.01); *C23C 16/403* (2013.01); *C23C 16/56* (2013.01); *C23C 28/042* (2013.01); *C23C 28/044* (2013.01); *C23C 30/005* (2013.01); *B23B 2224/04* (2013.01); *B23B 2228/10* (2013.01)

(58) Field of Classification Search
USPC .......... 51/307, 309; 428/216, 336, 698, 701, 428/702
See application file for complete search history.

(56) References Cited

U.S. PATENT DOCUMENTS

| | | | |
|---|---|---|---|
| 2008/0292905 A1 | 11/2008 | Okada et al. | |
| 2009/0297835 A1 | 12/2009 | Okada et al. | |
| 2016/0175940 A1* | 6/2016 | Lindahl | ................. B23B 27/148 428/141 |

FOREIGN PATENT DOCUMENTS

| | | |
|---|---|---|
| JP | 4739235 B2 | 8/2011 |
| JP | 4739236 B2 | 8/2011 |

* cited by examiner

*Primary Examiner* — Archene A Turner
(74) *Attorney, Agent, or Firm* — Studebaker & Brackett PC

(57) ABSTRACT

A coated cutting tool comprising a substrate and a coating layer formed on a surface of the substrate, the coated cutting tool having a rake surface and a flank, in which the coating layer includes an α-type aluminum oxide layer, wherein: the α-type aluminum oxide layer has, on an opposite side to the substrate, a first interface, being the rake surface or a surface substantially parallel to the rake surface, a second interface, being the flank or a surface substantially parallel to the flank, and an intersecting edge between the first interface and the second interface; and the α-type aluminum oxide layer satisfies $-600 \leq \sigma11 \leq 300$, $-900 \leq \sigma22 \leq 250$ and $\sigma11 > \sigma22$. (In the above formulae, $\sigma11$ denotes a residual stress value (MPa) in a direction parallel to the intersecting edge, $\sigma22$ denotes a residual stress value (MPa) in a direction orthogonal to the intersecting edge, and each of the residual stress values is a value measured by a 2D method).

15 Claims, 1 Drawing Sheet

COATED CUTTING TOOL

TECHNICAL FIELD

The present invention relates to a coated cutting tool.

BACKGROUND ART

A conventional coated cutting tool used for the cutting of steel, cast iron, etc., is a coated cutting tool which is obtained by depositing, via chemical vapor deposition, a coating layer with a total thickness of from 3 μm or more to 20 μm or less on a surface of a substrate consisting of a cemented carbide. A known example of the above coating layer is a coating layer consisting of a single layer of one kind selected from the group consisting of a Ti carbide, a Ti nitride, a Ti carbonitride, a Ti carboxide, a Ti carboxynitride, and aluminum oxide, or consisting of multiple layers of two or more kinds selected therefrom.

JP4739235 B discloses a coated cutting tool comprising a substrate and a coating formed on the substrate, wherein: the coating includes a first coating comprised of TiCN and a second coating comprised of α-type $Al_2O_3$; the first coating has tensile stress S1 and the second coating has compressive stress S2; and the tensile stress S1 and the compressive stress S2 satisfy the relationship of 400 MPa≤I S2−S1 I≤3,500 MPa.

JP4739236 B discloses a coated cutting tool comprising a substrate and a coating formed on the substrate, wherein: the coating includes a first coating comprised of TiCN and a second coating comprised of α-type $Al_2O_3$; the first coating has tensile stress or is released from tensile stress to substantially have no stress; the second coating has compressive stress S1 on a rake surface and tensile stress S2 on a flank; and the compressive stress S1 and the tensile stress S2 satisfy the relationship of 441 MPa≤I S1−S2 I≤3,500 MPa.

SUMMARY OF THE INVENTION

Technical Problem

An increase in speed, feed and depth of cut has become more conspicuous in cutting in recent times. Thus, a tool may often fracture due to chipping which occurs at the boundary between a cutting part and a non-cutting part due to a load applied onto the tool during machining.

Based on such background, each of the tools disclosed in JP4739235 B and JP4739236 B has insufficient fracture resistance under cutting conditions which place a large load on a coated cutting tool, and the life thereof is therefore required to be further improved.

The present invention has been made in order to solve this problem, and an object of the present invention is to provide a coated cutting tool which has excellent wear resistance and fracture resistance and thereby allows the tool life to be extended.

Solution to Problem

The present inventor has conducted studies regarding extending the tool life of a coated cutting tool from the above-described perspective and has then obtained the findings set forth below. More specifically, the following configurations, including setting the residual stress of an α-type aluminum oxide layer at a predetermined value, suppress the occurrence of chipping at the boundary between a cutting part and a non-cutting part without a reduction in wear resistance, and this allows the fracture resistance of the tool to be improved, as a result of which the tool life can be extended. The inventor has obtained such findings, and this has led to the completion of the present invention.

Namely, the present invention is as set forth below:

[1] A coated cutting tool comprising a substrate and a coating layer formed on a surface of the substrate, the coated cutting tool having a rake surface and a flank, in which the coating layer includes an α-type aluminum oxide layer, wherein:

the α-type aluminum oxide layer has, on an opposite side to the substrate, a first interface, being the rake surface or a surface substantially parallel to the rake surface, a second interface, being the flank or a surface substantially parallel to the flank, and an intersecting edge between the first interface and the second interface; and the α-type aluminum oxide layer satisfies conditions represented by formulae (A), (B) and (C).

$$-600 \leq \sigma 11 \leq 300 \quad (A)$$

$$-900 \leq \sigma 22 \leq 250 \quad (B)$$

$$\sigma 11 > \sigma 22 \quad (C)$$

(In the above formulae, σ11 denotes a residual stress value (unit: MPa) in a direction parallel to the intersecting edge, σ22 denotes a residual stress value (unit: MPa) in a direction orthogonal to the intersecting edge, and each of the residual stress values is a value measured by a multi-axial stress measurement method or a full Debye ring fitting method.)

[2] The coated cutting tool, wherein each of the residual stress values is a value measured, in the α-type aluminum oxide layer, at a position 50 μm from the intersecting edge along the first surface.

[3] The coated cutting tool, wherein σ11 is from −600 MPa or higher to 0 MPa or lower and σ22 is from −900 MPa or higher to −100 MPa or lower.

[4] The coated cutting tool, wherein, in the α-type aluminum oxide layer, a texture coefficient TC (0,0,12) of a (0,0,12) plane represented by formula (1) below is from 4.0 or more to 8.4 or less.

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

(In formula (1), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on a JCPDS Card No. 10-0173 for α-type aluminum oxide, and (h,k,l) refers to nine crystal planes of (0,1,2), (1,0,4), (1,1,0), (1,1,3), (1,1,6), (0,1,8), (2,1,4), (3,0,0) and (0,0,12).)

[5] The coated cutting tool, wherein the α-type aluminum oxide layer satisfies a condition represented by formula (D) below.

$$\sigma 11 - \sigma 22 > 100 \quad (D)$$

[6] The coated cutting tool, wherein an average thickness of the α-type aluminum oxide layer is from 1.0 μm or more to 15.0 μm or less.

[7] The coated cutting tool, wherein the coating layer comprises a titanium carbonitride layer, being comprised of titanium carbonitride, between the substrate and the α-type aluminum oxide layer, and an average thickness of the titanium carbonitride layer is from 1.0 μm or more to 20.0 μm or less.

[8] The coated cutting tool, wherein the coating layer comprises, between the titanium carbonitride layer and the α-type aluminum oxide layer, an intermediate layer comprising a compound of at least one kind selected from the group consisting of a Ti carboxide, a Ti oxynitride and a Ti carboxynitride.

[9] The coated cutting tool, wherein an average thickness of the intermediate layer is from 0.1 µm or more to 1.5 µm or less.

[10] The coated cutting tool, wherein an average thickness of the coating layer is from 3.0 µm or more to 30.0 µm or less.

[11] The coated cutting tool, wherein the coating layer comprises a titanium nitride layer, being comprised of titanium nitride, as an outermost layer on a surface of the α-type aluminum oxide layer.

[12] The coated cutting tool, wherein the substrate is any of a cemented carbide, cermet, ceramics and a sintered body containing cubic boron nitride.

The present invention can provide a coated cutting tool which has excellent wear resistance and fracture resistance and thereby allows the tool life to be extended.

DESCRIPTION OF EMBODIMENTS

Figure 1:
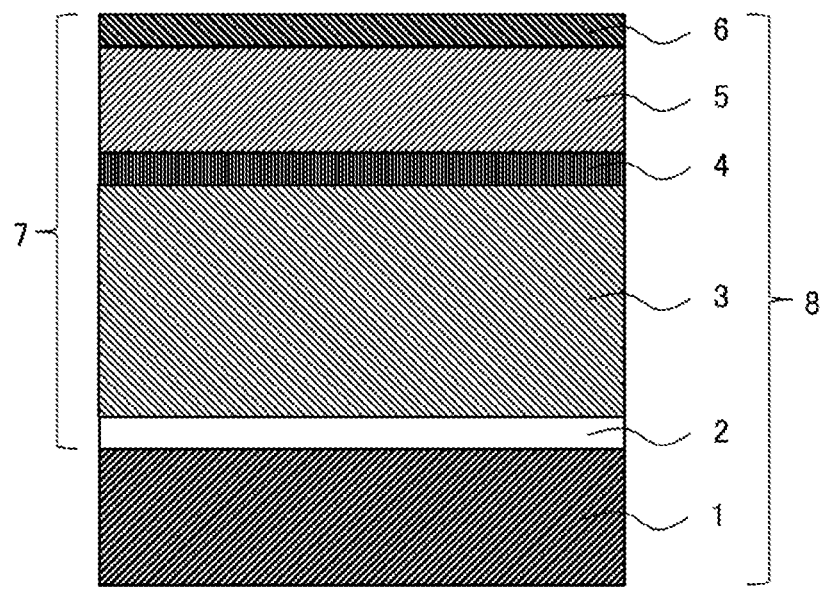
FIG. 1 is a schematic cross-sectional view partially showing an example of a coated cutting tool according to the present invention.

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

The coated cutting tool according to the present embodiment is a coated cutting tool comprising a substrate and a coating layer formed on a surface of the substrate, the coated cutting tool having a rake surface and a flank, in which the coating layer includes an α-type aluminum oxide layer, wherein: the α-type aluminum oxide layer has, on a side opposite to the substrate, a first interface, being the rake surface or a surface substantially parallel to the rake surface, a second interface, being the flank or a surface substantially parallel to the flank, and an intersecting edge between the first interface and the second interface; and the α-type aluminum oxide layer satisfies conditions represented by formulae (A), (B) and (C) below. The "interface" in the case where the α-type aluminum oxide layer serves as an outermost layer refers to a surface of the α-type aluminum oxide layer. Given the above, the first interface is the rake surface, and the second interface is the flank. Meanwhile, the "interface" in the case where another layer is formed as an outermost layer on the α-type aluminum oxide layer refers to an interface between the α-type aluminum oxide layer and the outermost layer. Given the above, the first interface is the surface substantially parallel to the rake surface, and the second interface is the surface substantially parallel to the flank. The term "substantially parallel" in the specification indicates that an angle formed by the surface direction of the rake surface and the surface direction of the first interface is from 0 to 1° and also indicates that an angle formed by the surface direction of the flank and the surface direction of the second interface is from 0 to 1°.

$$-600 \leq \sigma 11 \leq 300 \tag{A}$$

$$-900 \leq \sigma 22 \leq 250 \tag{B}$$

$$\sigma 11 > \sigma 22 \tag{C}$$

In the above formulae, σ11 denotes a residual stress value (unit: MPa) in a direction parallel to the intersecting edge, σ22 denotes a residual stress value (unit: MPa) in a direction orthogonal to the intersecting edge (a direction orthogonal to σ11), and each residual stress value is a value measured by a multi-axial stress measurement method or a full Debye ring fitting method (hereinafter also collectively referred to as a "2D method"). It should be noted that, while σ22 denotes a residual stress value in the direction orthogonal to the intersecting edge, the "orthogonal direction" intended here refers to a thickness direction of the α-type aluminum oxide layer.

In the coated cutting tool of the present embodiment, the α-type aluminum oxide layer satisfies the conditions represented by formulae (A), (B) and (C), thereby leading to excellent wear resistance and fracture resistance. The factors therefor can be considered to be those set forth below but are not limited thereto.

(1) σ11 is −600 MPa or higher, and this suppresses an excessive compressive stress which involves the destruction of particles of the α-type aluminum oxide layer, thereby leading to the suppression of the progress of wear due to the falling of particles, which results in an improvement of wear resistance. Further, σ11 is 300 MPa or lower, and this suppresses an excessive tensile stress which invites the occurrence or progress of cracking, thereby leading to the suppression of the progress of cracking which has occurred during cutting, which results in an improvement of fracture resistance.

(2) σ22 is −900 MPa or higher, and this suppresses an excessive compressive stress which involves the destruction of particles of the α-type aluminum oxide layer, thereby leading to the suppression of the progress of wear due to the falling of particles, which results in an improvement of wear resistance. Further, σ22 is 250 MPa or lower, and this suppresses an excessive tensile stress which invites the occurrence or progress of cracking, thereby reducing the chipping size, which results in an improvement of fracture resistance.

(3) σ11>σ22 can suppress the progress of minute cracking in the direction orthogonal to the intersecting edge, thereby leading to the suppression of the occurrence of damage at the boundary between a cutting part and a non-cutting part in the coated cutting tool, which results in an improvement of fracture resistance.

Figure 2:
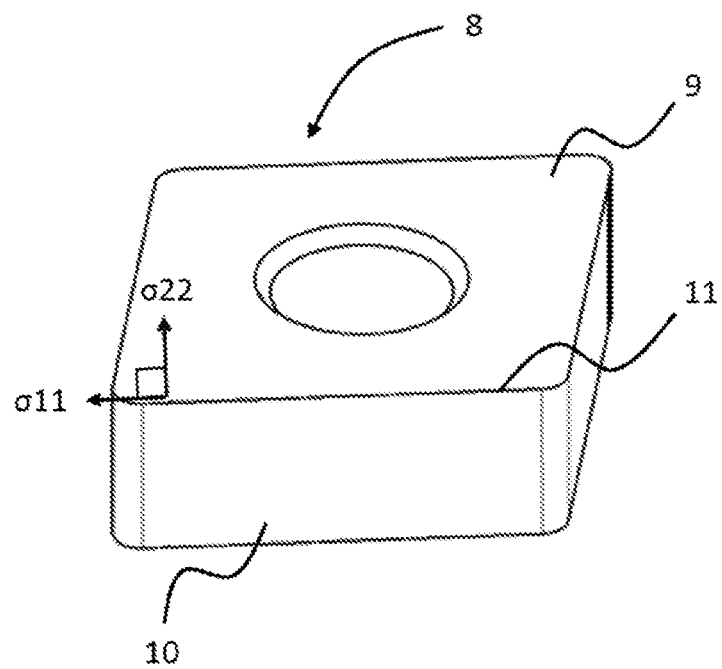
FIG. 2 is a perspective view showing an example of the coated cutting tool according to the present invention.

FIG. 1 is a schematic cross-sectional view partially showing an example of a coated cutting tool according to the present embodiment. A coated cutting tool 8 comprises a substrate 1 and a coating layer 7 formed on a surface of the substrate 1. In the coating layer 7, a lowermost layer 2, a titanium carbonitride layer 3, an intermediate layer 4, an α-type aluminum oxide layer 5 and an outermost layer 6 are laminated in this order from the substrate side. FIG. 2 is a perspective view showing an example of the coated cutting tool according to the present embodiment. The coated cutting tool 8 shown in FIG. 2 is the same as the coated cutting tool 8 shown in FIG. 1; however, for the purpose of description, the outermost layer 6 is not shown. The coated cutting tool 8 shown in FIG. 2 has a first interface 9, a second interface 10 and an intersecting edge 11 between the first interface 9 and the second interface 10. In this example, for the purpose of description, σ11 denotes a residual stress value in a direction orthogonal to a direction parallel to the intersecting edge 11, and σ22 denotes a residual stress value in a direction orthogonal to the intersecting edge 11.

A coated cutting tool according to the present embodiment comprises a substrate and a coating layer formed on a surface of the substrate. The coated cutting tool has a rake surface and a flank. Specific examples of types of the coated cutting tool include an indexable cutting insert for milling or turning, a drill and an end mill.

The substrate in the present embodiment is not particularly limited, as long as it is used as a substrate for the coated cutting tool. Examples of such substrate include a cemented carbide, cermet, ceramic, a sintered body containing cubic boron nitride, a diamond sintered body and high-speed steel. From among the above examples, the substrate is preferably comprised of any of a cemented carbide, cermet, ceramics and a sintered body containing cubic boron nitride, as this provides excellent wear resistance and fracture resistance. From the same perspective, the substrate is more preferably comprised of a cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided, even if the substrate surface has been modified in this way.

The average thickness of the coating layer in the present embodiment is preferably from 3.0 μm or more to 30.0 μm or less. If the average thickness is 3.0 μm or more, this indicates the tendency of the wear resistance to be further improved, and, if such average thickness is 30.0 μm or less, this indicates the tendency of the adhesion with the substrate of the coating layer and the fracture resistance to be further improved. From the same perspective, the average thickness of the coating layer is more preferably from 5.0 μm or more to 27.0 μm or less, and is further preferably from 9.0 μm or more to 25.0 μm or less.

The coating layer of the present embodiment includes at least one α-type aluminum oxide layer. The α-type aluminum oxide layer satisfies the condition represented by formula (A) above. If σ11 is −600 MPa or higher, this allows the wear resistance of the coated cutting tool to be improved because the progress of wear due to the falling of particles can be suppressed. If σ11 is 300 MPa or lower, this allows the fracture resistance of the coated cutting tool to be improved because the progress of cracking generated during cutting can be suppressed. From the same perspective, σ11 is preferably from −600 MPa or higher to 0 MPa or lower.

The α-type aluminum oxide layer of the present embodiment satisfies the condition represented by formula (B) above. If σ22 is −900 MPa or higher, this allows the wear resistance of the coated cutting tool to be improved because the progress of wear due to the falling of particles can be suppressed. If σ22 is 250 MPa or lower, this allows the fracture resistance of the coated cutting tool to be improved because the chipping size can be reduced. From the same perspective, σ22 is preferably from −900 MPa or higher to −100 MPa or lower.

The α-type aluminum oxide layer of the present embodiment satisfies the condition represented by formula (C) above. If the relationship of σ11>σ22 is satisfied, this allows the fracture resistance of the coated cutting tool to be improved because the occurrence of damage can be suppressed at the boundary between a cutting portion and a non-cutting portion. From the same perspective, the α-type aluminum oxide layer of the present embodiment preferably satisfies a condition represented by formula (D) below.

$$\sigma 11 - \sigma 22 > 100 \quad (D)$$

The residual stress values σ11 and σ22 in the α-type aluminum oxide layer of the present embodiment are measured by a multi-axial stress measurement method or a full Debye ring fitting method. Further, the measurement of residual stress values of the α-type aluminum oxide layer employs a peak intensity for a (116) plane in X-ray diffraction. As to the conditions for X-ray diffraction measurement, Cu-Kα radiation is used as a radiation source for X-rays, radiation is performed under the condition of an output of 50 kV, 1.0 mA, whereby residual stress values are measured. At this time, each of the residual stress values σ11 and σ22 is preferably a value measured, in the α-type aluminum oxide layer, at a position 50 μm from the intersecting edge along the first surface. Further, the residual stresses at any three points of the α-type aluminum oxide layer are measured by a 2D method, and it is preferable to obtain the arithmetic mean of the residual stresses at such three points. In the present embodiment, for instance, in the first interface of the α-type aluminum oxide layer, the residual stress values σ11 and σ22, each of which is measured at a position 50 μm from the intersecting edge, are defined to respectively fall within predetermined numerical ranges, and the relationship between σ11 and σ22 is defined.

In the α-type aluminum oxide layer of the present embodiment, a texture coefficient TC (0,0,12) of a (0,0,12) plane represented by formula (1) below is preferably from 4.0 or more to 8.4 or less. When the texture coefficient TC (0,0,12) is 4.0 or more, the ratio of a peak intensity I (0,0,12) for the (0,0,12) plane is high, thereby resulting in the tendency of the falling of particles to be suppressed and in turn resulting in the tendency of excellent wear resistance to be provided. From the same perspective, the texture coefficient TC (0,0,12) in the α-type aluminum oxide layer is more preferably 5.0 or more, and is further preferably 6.0 or more. Further, the texture coefficient TC (0,0,12) is more preferably 8.2 or less.

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

Herein, in formula (1), I (h,k,l) denotes a peak intensity for an (h,k,l) plane in X-ray diffraction of the α-type aluminum oxide layer, $I_0$ (h,k,l) denotes a standard diffraction intensity for the (h,k,l) plane which is indicated on a JCPDS Card No. 10-0173 for α-type aluminum oxide, and (h,k,l) refers to nine crystal planes of (0,1,2), (1,0,4), (1,1,0), (1,1,3), (1,1,6), (0,1,8), (2,1,4), (3,0,0) and (0,0,12). Accordingly, I (0,0,12) denotes a peak intensity for the (0,0,12) plane in X-ray diffraction of the α-type aluminum oxide layer, and $I_0$ (0,0,12) denotes a standard diffraction intensity for the (0,0,12) plane which is indicated on a JCPDS Card No. 10-0173 for α-type aluminum oxide.

The average thickness of the α-type aluminum oxide layer of the present embodiment is preferably from 1.0 μm or more to 15.0 μm or less. If the average thickness of the α-type aluminum oxide layer is 1.0 μm or more, this indicates the tendency of the crater wear resistance in the rake surface of the coated cutting tool to be further improved, and, if such average thickness is 15.0 μm or less, this indicates the tendency of the fracture resistance of the coated cutting tool to be further improved as the peeling of the coating layer is further suppressed. From the same perspective, the average thickness of the α-type aluminum oxide layer is more preferably from 1.5 μm or more to 12.0 μm or less, and is further preferably from 3.0 μm or more to 10.0 μm or less.

The coating layer of the present embodiment preferably comprises a titanium carbonitride layer, being comprised of titanium carbonitride, between the substrate and the α-type aluminum oxide layer because this leads to a further improvement of wear resistance. The average thickness of the titanium carbonitride layer of the present embodiment is preferably from 1.0 μm or more to 20.0 μm or less. If the average thickness of the titanium carbonitride layer is 1.0 μm or more, this indicates the tendency of the wear resistance of the coated cutting tool to be further improved, and, if such average thickness is 20.0 μm or less, this indicates the tendency of the fracture resistance of the coated cutting tool to be further improved as the peeling of the coating layer is further suppressed. From the same perspective, the average thickness of the titanium carbonitride layer is more preferably from 5.0 μm or more to 15.0 μm or less.

The coating layer of the present embodiment preferably comprises, between the titanium carbonitride layer and the α-type aluminum oxide layer, an intermediate layer comprising a compound of at least one kind selected from the group consisting of a Ti carboxide, a Ti oxynitride and a Ti carboxynitride as this leads to adhesion being further improved. The average thickness of such intermediate layer is preferably from 0.1 μm or more to 1.5 μm or less. If the average thickness of the intermediate layer is 0.1 μm or more, this indicates the tendency of the adhesion to be further improved, and, if such average thickness is 1.5 μm or less, this indicates the tendency of the texture coefficient TC (0,0,12) of the (0,0,12) plane in the α-type aluminum oxide layer to have a greater value.

The coating layer of the present embodiment preferably comprises a titanium nitride layer, being comprised of titanium nitride, as an outermost layer on a surface of the α-type aluminum oxide layer as this makes it possible to confirm the usage state, such as whether or not the coated cutting tool has been used, thereby leading to excellent visibility. The average thickness of the titanium nitride layer is preferably from 0.2 μm or more to 1.0 μm or less. This is preferable in that: if the average thickness of the titanium nitride layer is 0.2 μm or more, this provides the effect of further suppressing the falling of particles from the α-type aluminum oxide layer; and, if such average thickness is 1.0 μm or less, the fracture resistance of the coated cutting tool is improved. However, the coating layer of the present embodiment may not comprise the outermost layer.

The coating layer of the present embodiment preferably comprises, between the substrate and the titanium carbonitride layer, a titanium nitride layer, being comprised of titanium nitride, or a titanium carbide layer, being comprised of titanium carbide, which serves as a lowermost layer of the coating layer, as this leads to adhesion being improved. The average thickness of the lowermost layer is preferably from 0.1 μm or more to 0.5 μm or less. If the average thickness of the lowermost layer is 0.1 μm or more, this indicates the tendency of the adhesion to be further improved as the lowermost layer has a more uniform structure. Meanwhile, if the average thickness of the lowermost layer is 0.5 μm or less, this indicates the tendency of the fracture resistance to be further enhanced as the lowermost layer is prevented from serving as a starting point of peeling.

Examples of a method of forming layers that constitute a coating layer in a coated cutting tool according to the present embodiment include the method set forth below. However, such method of forming layers is not limited thereto.

For instance, a TiN layer, being a layer comprised of titanium nitride, which serves as the outermost layer, can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 850° C. or higher to 920° C. or lower, and a pressure of from 100 hPa or higher to 400 hPa or lower.

A TiC layer, being a layer comprised of titanium carbide, which serves as the lowermost layer, can be formed by chemical vapor deposition with a raw material composition of $TiCl_4$: from 2.0 mol % or more to 3.0 mol % or less, $CH_4$: from 4.0 mol % or more to 6.0 mol % or less, and $H_2$: the balance, a temperature of from 980° C. or higher to 1,020° C. or lower, and a pressure of from 60 hPa or higher to 80 hPa or lower.

A TiCN layer, being a layer comprised of titanium carbonitride, can be formed by chemical vapor deposition with a raw material composition of $TiCl_4$: from 8.0 mol % or more to 18.0 mol % or less, $CH_3CN$: from 1.0 mol % or more to 3.0 mol % or less, and $H_2$: the balance, a temperature of from 840° C. or higher to 890° C. or lower, and a pressure of from 60 hPa or higher to 80 hPa or lower.

A TiCNO layer, being a layer comprised of a Ti carboxynitride, can be formed by chemical vapor deposition with a raw material composition of $TiCl_4$: from 3.0 mol % or more to 5.0 mol % or less, CO: from 0.4 mol % or more to 1.0 mol % or less, $N_2$: from 30 mol % or more to 40 mol % or less, and $H_2$: the balance, a temperature of from 975° C. or higher to 1,025° C. or lower, and a pressure of from 90 hPa or higher to 110 hPa or lower.

A TiCO layer, being a layer comprised of a Ti carboxide, can be formed by chemical vapor deposition with a raw material composition of $TiCl_4$: from 0.5 mol % or more to 1.5 mol % or less, CO: from 2.0 mol % or more to 4.0 mol % or less, and $H_2$: the balance, a temperature of from 975° C. or higher to 1,025° C. or lower, and a pressure of from 60 hPa or higher to 100 hPa or lower.

A TiN layer, being comprised of titanium nitride, which serves as the outermost layer, can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 980° C. or higher to 1,020° C. or lower, and a pressure of from 100 hPa or higher to 400 hPa or lower.

In the present embodiment, a coated cutting tool which involves the controlled orientation (orientation relationship) of an α-type aluminum oxide layer can be obtained by, for example, the method set forth below.

Firstly, a lowermost layer (a titanium nitride layer or a titanium carbide layer), a titanium carbonitride layer and an intermediate layer are formed, in this order, on a surface of a substrate. It should be noted that, in the present embodiment, the layers other than the α-type aluminum oxide layer are not necessarily required. Next, when the above layers have been formed, from among such layers, a surface of a layer which is most distant from the substrate is oxidized. Thereafter, a nucleus of an α-type aluminum oxide layer is formed on the surface of the layer which is most distant from the substrate, and an α-type aluminum oxide layer is then formed in the state in which such nucleus has been formed. Further, as needed, a TiN layer may be formed on a surface of the α-type aluminum oxide layer.

The nucleus of the α-type aluminum oxide layer is formed with a very small amount of CO gas being caused to flow at a low temperature. This leads to the formation of the nucleus of the α-type aluminum oxide layer at a very slow rate and also leads to the nucleus of the α-type aluminum oxide layer being minute. The time for the formation of the nucleus of the α-type aluminum oxide layer is preferably from 2 minutes or more to 5 minutes or less. Thus, the α-type aluminum oxide layer is prone to have preferential orientation of a (0,0,12) plane.

It is preferable that, after the formation of the nucleus of the α-type aluminum oxide layer, the α-type aluminum oxide layer is formed under the condition that a CO gas is not caused to flow. At this time, the deposition temperature is preferably made higher than the temperature at which the nucleus of the α-type aluminum oxide layer is formed.

More specifically, the oxidation of the surface of the layer which is most distant from the substrate is performed under the conditions of a raw material composition of $CO_2$: from 0.1 mol % or more to 1.0 mol % or less and $H_2$: the balance, a temperature of from 950° C. or higher to 1,000° C. or lower, and a pressure of from 50 hPa or higher to 70 hPa or lower. Here, the oxidation process time is preferably from 5 minutes or more to 10 minutes or less.

Thereafter, the nucleus of the α-type aluminum oxide layer is formed by chemical vapor deposition with a raw material composition of $AlCl_3$: from 1.0 mol % or more to 4.0 mol % or less, $CO_2$: from 1.0 mol % or more to 3.0 mol % or less, CO: from 0.1 mol % or more to 2.0 mol % or less, HCl: from 2.0 mol % or more to 3.0 mol % or less, and $H_2$: the balance, a temperature of from 880° C. or higher to 930° C. or lower, and a pressure of from 60 hPa or higher to 80 hPa or lower.

The α-type aluminum oxide layer is then formed by chemical vapor deposition with a raw material composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.15 mol % or more to 0.25 mol % or less, and $H_2$: the balance, a temperature of from 970° C. or higher to 1,030° C. or lower, and a pressure of from 60 hPa or higher to 80 hPa or lower.

In the present embodiment, a coated cutting tool which involves the controlled residual stress value of a coating layer can be obtained by, for example, the method set forth below.

After the formation of the coating layer, dry shot blasting is performed thereon in two stages, as described below, whereby the residual stress value of the α-type aluminum oxide layer can be controlled, thereby resulting in the tendency of the conditions represented by formulae (A), (B) and (C) above to be satisfied as well as the tendency of the condition represented by formula (D) above to be satisfied. As to the first-stage condition for dry shot blasting, a shot material may be shot onto the flank of the coated cutting tool at a shot pressure of from 0.7 bar or higher to 1.5 bar or lower and for a shot time of from 1 second or more to 5 seconds or less so as to achieve a shot angle of around 90°. The shot material used for the first stage of dry shot blasting is preferably served by particles of $Al_2O_3$ or $ZrO_2$ with an average particle size of from 80 μm or more to 150 μm or less. As to the second-stage condition for dry shot blasting, a shot material may be shot onto the rake surface of the coated cutting tool at a shot pressure of from 1.0 bar or higher to 1.5 bar or lower and for a shot time of from 1 second or more to 5 seconds or less so as to achieve a shot angle of around 90°. The shot material used for the second stage of dry shot blasting is preferably served by particles of $Al_2O_3$ or $ZrO_2$ with an average particle size of from 100 μm or more to 200 μm or less.

The thickness of each layer in the coating layer and the average thickness of the entire coating layer in the coated cutting tool of the present embodiment can be measured by observing a cross-sectional structure of the coated cutting tool, using an optical microscope, a scanning electron microscope (SEM), an FE-SEM, or the like. It should be noted that, as to the average thickness of each layer and the average thickness of the entire coating layer in the coated cutting tool of the present embodiment, each of such average thicknesses can be obtained by: measuring the thickness of each layer or the thickness of the entire coating layer at three or more locations near the position 50 μm from the edge, toward the center of the rake surface of the coated cutting tool; and calculating the arithmetic mean of the resulting measurements. Further, the composition of each layer can be measured from a cross-sectional structure of the coated cutting tool of the present embodiment, using an energy-dispersive X-ray spectroscope (EDS), a wavelength-dispersive X-ray spectroscope (WDS), or the like.

EXAMPLES

Although the present invention will be described in further detail below, with examples, the present invention is not limited to such examples.

A cemented carbide cutting insert with a shape of JIS certified VNMG160408 and a composition of 91.5WC-8.000-0.5$Cr_3C_2$ (mass %) was prepared as a substrate. The edge of such substrate was subjected to round honing by means of an SiC brush, and a surface of the substrate was then washed.

After the substrate surface was washed, a coating layer was formed by chemical vapor deposition. As to invention samples 1 to 11, firstly, the substrate was placed in an external heating chemical vapor deposition apparatus, and a lowermost layer, whose composition is shown in Table 1, was formed on the substrate surface so as to have the average thickness shown in Table 1 under the raw material composition, temperature and pressure conditions shown in Table 2. Then, a titanium carbonitride layer (hereinafter referred to as a "TiCN layer"), whose composition is shown in Table 1, was formed on the surface of the lowermost layer so as to have the average thickness shown in Table 1 under the raw material composition, temperature and pressure conditions shown in Table 2. Next, an intermediate layer, whose composition is shown in Table 1, was formed on the surface of the TiCN layer so as to have the average thickness shown in Table 1 under the raw material composition, temperature and pressure conditions shown in Table 2. Thereafter, the surface of the intermediate layer was oxidized, using a gas having the composition shown in Table 3, under the temperature and pressure conditions shown in Table 3. At this time, the oxidation process time was set at 7 minutes. Then, a nucleus of α-type aluminum oxide was formed on the oxidized surface of the intermediate layer under the raw material composition, temperature and pressure conditions concerning the "nucleus formation conditions for an α-type aluminum oxide layer" shown in Table 4. At this time, the time for the formation of the nucleus of an α-type aluminum oxide layer was set at 4 minutes. Further, an α-type aluminum oxide layer, whose composition is shown in Table 1, was formed on the surface of the intermediate layer and the surface of the nucleus of α-type aluminum oxide so as to have the average thickness shown in Table 1 under the raw material composition, temperature and pressure conditions concerning the "deposition conditions" shown in Table 4. Lastly, an outermost layer, whose composition is shown in Table 1, was formed on the surface of the α-type aluminum oxide layer so as to have the average thickness shown in Table 1 under the raw material composition, temperature and pressure conditions shown in Table 2. As a result, the coated cutting tools of invention samples 1 to 11 were obtained.

Meanwhile, as to comparative samples 1 to 9, firstly, the substrate was placed in an external heating chemical vapor deposition apparatus, and a lowermost layer, whose composition is shown in Table 1, was formed on the substrate surface so as to have the average thickness shown in Table 1 under the raw material composition, temperature and pressure conditions shown in Table 2. Then, a TiCN layer, whose composition is shown in Table 1, was formed on the surface of the lowermost layer so as to have the average thickness shown in Table 1 under the raw material composition, temperature and pressure conditions shown in Table 2. Next, an intermediate layer, whose composition is shown in Table 1, was formed on the surface of the TiCN layer so as to have the average thickness shown in Table 1 under the raw material composition, temperature and pressure conditions shown in Table 2. Thereafter, the surface of the intermediate layer was oxidized, using a gas having the composition shown in Table 3, under the temperature and pressure conditions shown in Table 3. At this time, the oxidation process time was set at 7 minutes. Then, a nucleus of an α-type aluminum oxide layer was formed on the oxidized surface of the intermediate layer under the raw material composition, temperature and pressure conditions concerning the "nucleus formation conditions" shown in Table 5. At this time, the time for the formation of the nucleus of an α-type aluminum oxide layer was set at 4 minutes. Further, an α-type aluminum oxide layer, whose composition is shown in Table 1, was formed on the surface of the intermediate layer and the surface of the nucleus of α-type aluminum oxide so as to have the average thickness shown in Table 1 under the raw material composition, temperature and pressure conditions concerning the "deposition conditions" shown in Table 5. Lastly, an outermost layer, whose composition is shown in Table 1, was formed on the surface of the α-type aluminum oxide layer so as to have the average thickness shown in Table 1 under the raw material composition, temperature and pressure conditions shown in Table 2. As a result, the coated cutting tools of comparative samples 1 to 9 were obtained.

The thickness of each layer of each of the samples was obtained as set forth below. That is, using an FE-SEM, the average thickness was obtained by: measuring the thickness of each layer, from each of the cross-sectional surfaces at three locations near the position 50 μm from the edge of the coated cutting tool, toward the center of the rake surface thereof; and calculating the arithmetic mean of the resulting measurements. Using an EDS, the composition of each layer of the obtained sample was measured from the cross-sectional surface near the position at most 50 μm from the edge of the coated cutting tool, toward the center of the rake surface thereof.

TABLE 1

| | Coating layer | | | | | | | | | | |
|---|---|---|---|---|---|---|---|---|---|---|---|
| | Lowermost layer | | TiCN layer | | Intermediate layer | | α-type aluminum oxide layer | | Outermost layer | | |
| Sample No. | Composition | Average thickness (μm) | Composition | Average thickness (μm) | Composition | Average thickness (μm) | Crystal system | Average thickness (μm) | Composition | Average thickness (μm) | Total thickness (μm) |
| Invention sample 1 | TiN | 0.1 | TiCN | 7.0 | TiCNO | 0.3 | α | 8.4 | TiN | 0.4 | 16.2 |
| Invention sample 2 | TiN | 0.3 | TiCN | 10.5 | TiCNO | 0.3 | α | 4.6 | TiN | 0.5 | 16.2 |
| Invention sample 3 | TiN | 0.1 | TiCN | 7.4 | TiCNO | 0.1 | α | 9.4 | TiN | 0.3 | 17.3 |
| Invention sample 4 | TiN | 0.1 | TiCN | 10.2 | TiCO | 0.1 | α | 9.0 | TiN | 0.5 | 19.9 |
| Invention sample 5 | TiN | 0.5 | TiCN | 19.0 | TiCNO | 0.5 | α | 4.8 | TiN | 0.2 | 25.0 |
| Invention sample 6 | TiN | 0.3 | TiCN | 7.2 | TiCNO | 0.3 | α | 10.0 | TiN | 0.3 | 18.1 |
| Invention sample 7 | TiN | 0.3 | TiCN | 4.5 | TiCNO | 0.5 | α | 9.2 | TiN | 0.2 | 14.7 |
| Invention sample 8 | TiC | 0.3 | TiCN | 5.5 | TiCNO | 0.5 | α | 3.0 | TiN | 0.5 | 9.8 |
| Invention sample 9 | TiN | 0.1 | TiCN | 3.0 | TiCNO | 0.1 | α | 15.2 | TiN | 0.6 | 19.0 |
| Invention sample 10 | TiN | 1.0 | TiCN | 4.2 | TiCO | 1.0 | α | 4.8 | TiN | 1.5 | 12.5 |
| Invention sample 11 | TiN | 1.5 | TiCN | 10.0 | TiCNO | 0.5 | α | 6.2 | TiN | 0.2 | 18.4 |
| Comparative sample 1 | TiN | 0.1 | TiCN | 10.0 | TiCO | 0.1 | α | 9.6 | TiN | 0.2 | 20.0 |
| Comparative sample 2 | TiN | 0.3 | TiCN | 4.2 | TiCO | 0.5 | α | 3.2 | TiN | 0.6 | 8.8 |
| Comparative sample 3 | TiN | 0.5 | TiCN | 7.2 | TiCNO | 0.5 | α | 5.0 | TiN | 0.2 | 13.4 |
| Comparative sample 4 | TiN | 0.1 | TiCN | 9.0 | TiCNO | 0.3 | α | 8.2 | TiN | 0.4 | 18.0 |
| Comparative sample 5 | TiN | 0.3 | TiCN | 10.5 | TiCNO | 1.0 | α | 10.4 | TiN | 1.5 | 23.7 |

TABLE 1-continued

| | Coating layer | | | | | | | | | | |
|---|---|---|---|---|---|---|---|---|---|---|---|
| | Lowermost layer | | TiCN layer | | Intermediate layer | | α-type aluminum oxide layer | | Outermost layer | | |
| Sample No. | Composition | Average thickness (μm) | Composition | Average thickness (μm) | Composition | Average thickness (μm) | Crystal system | Average thickness (μm) | Composition | Average thickness (μm) | Total thickness (μm) |
| Comparative sample 6 | TiN | 0.5 | TiCN | 9.8 | TiCNO | 0.5 | α | 4.8 | TiN | 0.4 | 16.0 |
| Comparative sample 7 | TiN | 1.0 | TiCN | 7.4 | TiCNO | 0.1 | α | 10.0 | TiN | 0.2 | 18.7 |
| Comparative sample 8 | TiN | 0.3 | TiCN | 7.2 | TiCNO | 0.3 | α | 10.2 | TiN | 0.2 | 18.2 |
| Comparative sample 9 | TiN | 0.3 | TiCN | 6.8 | TiCNO | 0.3 | α | 9.8 | TiN | 0.2 | 17.4 |

TABLE 2

| Each layer composition | Temperature (° C.) | Pressure (hPa) | Raw material composition (mol %) |
|---|---|---|---|
| TiN (lowermost layer) | 900 | 350 | TiCl$_4$: 7.5%, N$_2$: 40.0%, H$_2$: 52.5% |
| TiC (lowermost layer) | 1,000 | 75 | TiCl$_4$: 2.4%, CH$_4$: 4.6%, H$_2$: 93.0% |
| TiCN | 840 | 70 | TiCl$_4$: 12.0%, CH$_3$CN: 2.0%, H$_2$: 86.0% |
| TiCNO | 1,000 | 100 | TiCl$_4$: 3.5%, CO: 0.7%, N$_2$: 35.5%, H$_2$: 60.3% |
| TiCO | 1,000 | 80 | TiCl$_4$: 1.3%, CO: 2.7%, H$_2$: 96.0% |
| TiN (outermost layer) | 1,000 | 350 | TiCl$_4$: 7.5%, N$_2$: 40.0%, H$_2$: 52.5% |

TABLE 3

| | Temperature (° C.) | Pressure (hPa) | Composition (mol %) |
|---|---|---|---|
| Oxidation process | 960 | 70 | CO$_2$: 0.5%, H$_2$: 99.5% |

TABLE 4

| | Nucleus formation conditions for an α-type aluminum oxide layer | | | Deposition conditions | | |
|---|---|---|---|---|---|---|
| Sample No. | Temperature (° C.) | Pressure (hPa) | Raw material composition (mol %) | Temperature (° C.) | Pressure (hPa) | Raw material composition (mol %) |
| Invention sample 1 | 900 | 70 | AlCl$_3$: 2.5%, CO$_2$: 2.0%, CO: 1.5%, HCl: 3.0%, H$_2$: 91.0% | 1,010 | 70 | AlCl$_3$: 4.0%, CO$_2$: 3.0%, HCl: 2.5%, H$_2$S: 0.2%, H$_2$: 90.3% |
| Invention sample 2 | 900 | 70 | AlCl$_3$: 3.5%, CO$_2$: 2.5%, CO: 1.5%, HCl: 2.0%, H$_2$: 90.5% | 970 | 70 | AlCl$_3$: 3.0%, CO$_2$: 2.5%, HCl: 3.0%, H$_2$S: 0.2%, H$_2$: 91.3% |
| Invention sample 3 | 880 | 70 | AlCl$_3$: 1.5%, CO$_2$: 1.0%, CO: 1.5%, HCl: 2.5%, H$_2$: 93.5% | 990 | 70 | AlCl$_3$: 2.0%, CO$_2$: 4.0%, HCl: 2.5%, H$_2$S: 0.2%, H$_2$: 91.3% |
| Invention sample 4 | 900 | 70 | AlCl$_3$: 3.0%, CO$_2$: 1.5%, CO: 2.0%, HCl: 3.0%, H$_2$: 90.5% | 1,010 | 70 | AlCl$_3$: 5.0%, CO$_2$: 3.0%, HCl: 3.0%, H$_2$S: 0.15%, H$_2$: 88.85% |
| Invention sample 5 | 880 | 60 | AlCl$_3$: 3.0%, CO$_2$: 3.0%, CO: 1.0%, HCl: 2.5%, H$_2$: 90.5% | 970 | 60 | AlCl$_3$: 4.0%, CO$_2$: 4.0%, HCl: 2.0%, H$_2$S: 0.2%, H$_2$: 89.8% |
| Invention sample 6 | 930 | 70 | AlCl$_3$: 3.5%, CO$_2$: 2.5%, CO: 1.5%, HCl: 2.0%, H$_2$: 90.5% | 1,010 | 70 | AlCl$_3$: 3.0%, CO$_2$: 2.5%, HCl: 3.0%, H$_2$S: 0.25%, H$_2$: 91.25% |
| Invention sample 7 | 900 | 80 | AlCl$_3$: 3.0%, CO$_2$: 2.0%, CO: 0.5%, HCl: 2.5%, H$_2$: 92.0% | 990 | 80 | AlCl$_3$: 4.5%, CO$_2$: 3.0%, HCl: 3.0%, H$_2$S: 0.2%, H$_2$: 89.3% |
| Invention sample 8 | 880 | 60 | AlCl$_3$: 3.0%, CO$_2$: 3.0%, HCl: 3.0%, H$_2$: 91.0% | 990 | 60 | AlCl$_3$: 3.0%, CO$_2$: 3.0%, HCl: 3.0%, H$_2$S: 0.2%, H$_2$: 90.8% |
| Invention sample 9 | 930 | 60 | AlCl$_3$: 3.0%, CO$_2$: 1.5%, CO: 2.0%, HCl: 3.0%, H$_2$: 90.5% | 1,010 | 60 | AlCl$_3$: 4.0%, CO$_2$: 4.0%, HCl: 2.0%, H$_2$S: 0.2%, H$_2$: 89.8% |
| Invention sample 10 | 900 | 70 | AlCl$_3$: 2.0%, CO$_2$: 2.0%, HCl: 2.5%, H$_2$: 93.5% | 1,030 | 70 | AlCl$_3$: 4.0%, CO$_2$: 4.0%, HCl: 2.5%, H$_2$S: 0.2%, H$_2$: 89.3% |
| Invention sample 11 | 900 | 80 | AlCl$_3$: 1.5%, CO$_2$: 1.0%, CO: 1.5%, HCl: 2.5%, H$_2$: 93.5% | 990 | 80 | AlCl$_3$: 4.0%, CO$_2$: 4.0%, HCl: 2.5%, H$_2$S: 0.15%, H$_2$: 89.35% |

TABLE 5

| | Nucleus formation conditions(1) | | | Deposition conditions | | |
|---|---|---|---|---|---|---|
| Sample No. | Temperature (° C.) | Pressure (hPa) | Raw material composition (mol %) | Temperature (° C.) | Pressure (hPa) | Raw material composition (mol %) |
| Comparative sample 1 | 900 | 70 | AlCl$_3$: 3.5%, CO$_2$: 2.5%, CO: 1.5%, HCl: 2.0%, H$_2$: 90.5% | 970 | 70 | AlCl$_3$: 3.0%, CO$_2$: 2.5%, HCl: 3.0%, H$_2$S: 0.2%, H$_2$: 91.3% |

TABLE 5-continued

| | Nucleus formation conditions(1) | | | Deposition conditions | | |
|---|---|---|---|---|---|---|
| Sample No. | Temperature (° C.) | Pressure (hPa) | Raw material composition (mol %) | Temperature (° C.) | Pressure (hPa) | Raw material composition (mol %) |
| Comparative sample 2 | 880 | 60 | $AlCl_3$: 3.0%, $CO_2$: 3.0%, CO: 1.0%, HCl: 2.5%, $H_2$: 90.5% | 970 | 60 | $AlCl_3$: 4.0%, $CO_2$: 4.0%, HCl: 2.0%, $H_2S$: 0.2%, $H_2$: 89.8% |
| Comparative sample 3 | 900 | 80 | $AlCl_3$: 3.0%, $CO_2$: 2.0%, CO: 0.5%, HCl: 2.5%, $H_2$: 92.0% | 990 | 80 | $AlCl_3$: 4.5%, $CO_2$: 3.0%, HCl: 3.0%, $H_2S$: 0.2%, $H_2$: 89.3% |
| Comparative sample 4 | 900 | 80 | $AlCl_3$: 4.0%, $CO_2$: 2.5%, CO: 0.5%, HCl: 2.5%, $H_2$: 90.5% | 990 | 80 | $AlCl_3$: 4.5%, $CO_2$: 3.0%, HCl: 3.0%, $H_2S$: 0.2%, $H_2$: 89.3% |
| Comparative sample 5 | 930 | 60 | $AlCl_3$: 3.0%, $CO_2$: 1.5%, CO: 2.0%, HCl: 3.0%, $H_2$: 90.5% | 1,010 | 60 | $AlCl_3$: 4.0%, $CO_2$: 4.0%, HCl: 2.0%, $H_2S$: 0.2%, $H_2$: 89.8% |
| Comparative sample 6 | 900 | 70 | $AlCl_3$: 2.0%, $CO_2$: 2.0%, HCl: 2.5%, $H_2$: 93.5% | 1,030 | 70 | $AlCl_3$: 4.0%, $CO_2$: 4.0%, HCl: 2.5%, $H_2S$: 0.2%, $H_2$: 89.3% |
| Comparative sample 7 | 880 | 70 | $AlCl_3$: 4.0%, $CO_2$: 1.0%, HCl: 3.0%, $H_2$: 92.0% | 1,010 | 70 | $AlCl_3$: 2.0%, $CO_2$: 3.0%, HCl: 2.5%, $H_2S$: 0.2%, $H_2$: 92.3% |
| Comparative sample 8 | 930 | 70 | $AlCl_3$: 2.0%, $CO_2$: 2.0%, HCl: 2.5%, $H_2$: 93.5% | 1,030 | 70 | $AlCl_3$: 4.0%, $CO_2$: 4.0%, HCl: 2.5%, $H_2S$: 0.2%, $H_2$: 89.3% |
| Comparative sample 9 | 880 | 60 | $AlCl_3$: 3.0%, $CO_2$: 3.0%, HCl: 3.0%, $H_2$: 91.0% | 990 | 60 | $AlCl_3$: 3.0%, $CO_2$: 3.0%, HCl: 3.0%, $H_2S$: 0.2%, $H_2$: 90.8% |

As to invention samples 1 to 11 and comparative samples 1 to 9, after the formation of the coating layer on the surface of the substrate, dry shot blasting was performed on a surface of the coating layer under the shot conditions shown in Table 6, using the shot material shown in Table 6. It should be noted that the term "no process" in the table refers to no performance of dry blasting.

TABLE 6

| | Condition (1) | | | | | Condition (2) | | | | |
|---|---|---|---|---|---|---|---|---|---|---|
| | Shot material | | Shot conditions | | | Shot material | | Shot conditions | | |
| Sample No. | Material | Average particle size (μm) | Shot angle (°) relative to flank | Shot pressure (bar) | Shot time (sec) | Material | Average particle size (μm) | Shot angle (°) relative to rake surface | Shot pressure (bar) | Shot time (sec) |
| Invention sample 1 | $ZrO_2$ | 150 | 90 | 1.0 | 3 | $Al_2O_3$ | 170 | 90 | 1.3 | 3 |
| Invention sample 2 | $Al_2O_3$ | 80 | 90 | 0.7 | 1 | $Al_2O_3$ | 100 | 90 | 1.0 | 1 |
| Invention sample 3 | $Al_2O_3$ | 150 | 90 | 0.7 | 3 | $Al_2O_3$ | 130 | 90 | 1.3 | 3 |
| Invention sample 4 | $ZrO_2$ | 150 | 90 | 1.0 | 3 | $Al_2O_3$ | 130 | 90 | 1.3 | 3 |
| Invention sample 5 | $ZrO_2$ | 150 | 90 | 1.5 | 4 | $ZrO_2$ | 200 | 90 | 1.5 | 3 |
| Invention sample 6 | $Al_2O_3$ | 120 | 90 | 0.7 | 3 | $Al_2O_3$ | 130 | 90 | 1.0 | 2 |
| Invention sample 7 | $ZrO_2$ | 120 | 90 | 0.7 | 3 | $ZrO_2$ | 130 | 90 | 1.5 | 2 |
| Invention sample 8 | $Al_2O_3$ | 150 | 90 | 1.3 | 3 | $Al_2O_3$ | 170 | 90 | 1.3 | 4 |
| Invention sample 9 | $Al_2O_3$ | 150 | 90 | 1.3 | 3 | $Al_2O_3$ | 190 | 90 | 1.3 | 3 |
| Invention sample 10 | $ZrO_2$ | 150 | 90 | 1.0 | 3 | $Al_2O_3$ | 170 | 90 | 1.3 | 3 |
| Invention sample 11 | $Al_2O_3$ | 100 | 90 | 0.7 | 1 | $Al_2O_3$ | 100 | 90 | 1.0 | 1 |
| Comparative sample 1 | | No process | | | | | No process | | | |
| Comparative sample 2 | $Al_2O_3$ | 130 | 45 | 1.2 | 3 | | No process | | | |
| Comparative sample 3 | $ZrO_2$ | 170 | 90 | 1.5 | 8 | $ZrO_2$ | 200 | 90 | 1.5 | 8 |
| Comparative sample 4 | $ZrO_2$ | 200 | 90 | 1.5 | 4 | $ZrO_2$ | 220 | 90 | 1.5 | 8 |
| Comparative sample 5 | $Al_2O_3$ | 80 | 90 | 0.5 | 1 | $Al_2O_3$ | 80 | 90 | 0.5 | 1 |
| Comparative sample 6 | $ZrO_2$ | 200 | 90 | 1.5 | 4 | $ZrO_2$ | 220 | 90 | 1.5 | 8 |
| Comparative sample 7 | $Al_2O_3$ | 150 | 45 | 1.5 | 4 | | No process | | | |

TABLE 6-continued

| | Condition (1) | | | | | Condition (2) | | | |
| | Shot material | | Shot conditions | | | Shot material | | Shot conditions | | |
| Sample No. | Material | Average particle size (μm) | Shot angle (°) relative to flank | Shot pressure (bar) | Shot time (sec) | Material | Average particle size (μm) | Shot angle (°) relative to rake surface | Shot pressure (bar) | Shot time (sec) |
|---|---|---|---|---|---|---|---|---|---|---|
| Comparative sample 8 | $Al_2O_3$ | 180 | 45 | 1.7 | 10 | | No process | | | |
| Comparative sample 9 | $ZrO_2$ | 200 | 30 | 1.8 | 12 | | No process | | | |

As to the obtained invention samples, i.e., invention samples 1 to 11 and comparative samples 1 to 9, an X-ray diffraction measurement by means of a 2θ/θ focusing optical system with Cu-Kα radiation was performed under the following conditions: an output: 50 kV, 250 mA; an incident-side solar slit: 5°; a divergence longitudinal slit: 2/3°; a divergence longitudinal limit slit: 5 mm; a scattering slit: 2/3°; a light-receiving side solar slit: 5°; a light-receiving slit: 0.3 mm; a BENT monochromator; a light-receiving monochrome slit: 0.8 mm; a sampling width: 0.01°; a scan speed: 4°/min; and a 2θ measurement range: 20°-155°. As to the apparatus, an X-ray diffractometer (model "RINT TTR III") manufactured by Rigaku Corporation was used. The peak intensity for each crystal plane of the α-type aluminum oxide layer was obtained from an X-ray diffraction pattern. A texture coefficient TC (0,0,12) in the α-type aluminum oxide layer was obtained from the resulting peak intensity for each crystal plane. The results are shown in Table 7.

TABLE 7

| Sample No. | α-type aluminum oxide TC (0, 0, 12) |
|---|---|
| Invention sample 1 | 7.4 |
| Invention sample 2 | 7.2 |
| Invention sample 3 | 6.6 |
| Invention sample 4 | 8.4 |
| Invention sample 5 | 5.0 |
| Invention sample 6 | 7.2 |
| Invention sample 7 | 4.2 |
| Invention sample 8 | 1.2 |
| Invention sample 9 | 8.2 |
| Invention sample 10 | 0.5 |
| Invention sample 11 | 6.5 |
| Comparative sample 1 | 7.2 |
| Comparative sample 2 | 5.1 |
| Comparative sample 3 | 4.0 |
| Comparative sample 4 | 4.3 |
| Comparative sample 5 | 7.9 |
| Comparative sample 6 | 0.5 |
| Comparative sample 7 | 0.3 |
| Comparative sample 8 | 0.5 |
| Comparative sample 9 | 0.7 |

As to each of the obtained samples, the residual stress values σ11 and σ22 of the α-type aluminum oxide layer were measured by a 2D method (a multi-axial stress measurement method/a full Debye ring fitting method). Further, the measurement of residual stress values of the α-type aluminum oxide layer employed the peak intensity for a (116) plane in X-ray diffraction. As to the conditions for X-ray diffraction measurement, Cu-Kα radiation was used as a radiation source for X-rays, radiation was performed under the condition of an output of 50 kV, 1.0 mA, whereby the residual stress values were measured. At this time, each of the residual stress values σ11 and σ22 was measured, in the α-type aluminum oxide layer, at a position 50 μm from the intersecting edge along the first surface. The residual stress values at any three points of the α-type aluminum oxide layer were measured by the 2D method, and the arithmetic mean of the residual stresses at such three points was obtained. Further, the resulting measurements were used to obtain the relationship between σ11 and σ22. The measurement results are shown in Table 8.

TABLE 8

| | α-type aluminum oxide layer | | | |
| Sample No. | σ11 (MPa) | σ22 (MPa) | σ11 − σ22 (MPa) | Relationship between σ11 and σ22 |
|---|---|---|---|---|
| Invention sample 1 | −398 | −502 | 104 | σ11 > σ22 |
| Invention sample 2 | 292 | 212 | 80 | σ11 > σ22 |
| Invention sample 3 | −166 | −284 | 118 | σ11 > σ22 |
| Invention sample 4 | −198 | −415 | 217 | σ11 > σ22 |
| Invention sample 5 | −590 | −802 | 212 | σ11 > σ22 |
| Invention sample 6 | 24 | −60 | 84 | σ11 > σ22 |
| Invention sample 7 | −210 | −366 | 156 | σ11 > σ22 |
| Invention sample 8 | −464 | −572 | 108 | σ11 > σ22 |
| Invention sample 9 | −488 | −515 | 27 | σ11 > σ22 |
| Invention sample 10 | −372 | −496 | 124 | σ11 > σ22 |
| Invention sample 11 | 280 | 105 | 175 | σ11 > σ22 |
| Comparative sample 1 | 425 | 421 | 4 | σ11 > σ22 |
| Comparative sample 2 | −114 | −112 | −2 | σ22 > σ11 |
| Comparative sample 3 | −708 | −868 | 160 | σ11 > σ22 |
| Comparative sample 4 | −764 | −920 | 156 | σ11 > σ22 |
| Comparative sample 5 | 376 | 324 | 52 | σ11 > σ22 |
| Comparative sample 6 | −780 | −946 | 166 | σ11 > σ22 |
| Comparative sample 7 | −154 | −150 | −4 | σ22 > σ11 |
| Comparative sample 8 | −685 | −688 | 3 | σ11 > σ22 |
| Comparative sample 9 | −920 | −922 | 2 | σ11 > σ22 |

Cutting tests 1 and 2 were conducted using the obtained samples, i.e., invention samples 1 to 11 and comparative samples 1 to 9, under the following conditions. Cutting test 1 is a wear test for evaluating wear resistance, and cutting test 2 is a fracture test for evaluating fracture resistance. The results of the respective cutting tests are shown in Table 9.

[Cutting Test 1]
Workpiece material: S45C round bar
Cutting speed: 290 m/min
Feed: 0.25 mm/rev
Depth of cut: 2.0 mm
Coolant: used
Evaluation items: A time when a sample was fractured or had a maximum flank wear width of 0.2 mm was defined as the end of the tool life, and the machining time to reach the end of the tool life was measured. It should be noted that, when a sample had a maximum flank wear width of 0.2 mm before the fracturing, this was evaluated as "normal wear," and when a sample was fractured, this was evaluated as "fracturing."

[Cutting Test 2]

Workpiece material: SCM415 round bar with two equidistant grooves extending in the length direction
  Cutting speed: 170 m/min
  Feed: 0.35 mm/rev
  Depth of cut: 1.5 mm
  Coolant: used
  Evaluation items: A time when a sample was fractured was defined as the end of the tool life, and the number of shocks the sample had received until the end of the tool life was measured. The number of times the sample and the workpiece material were brought into contact with each other was defined as the number of shocks, and the test was ended when the sample was fractured. It should be noted that, as to each sample, five inserts were prepared and the number of shocks was measured for each of such cutting inserts, and the arithmetic mean was obtained from the measurements of the number of shocks so as to serve as the tool life.

As to the machining time to reach the end of the tool life in cutting test 1 (wear test), evaluations were made with grade "A" for 20 minutes or more, grade "B" for 15 minutes or more and less than 20 minutes, and grade "C" for less than 15 minutes. Further, as to the number of shocks until the end of the tool life in cutting test 2 (fracture test), evaluations were made with grade "A" for 10,000 or more, grade "B" for 5,000 or more and less than 10,000, and grade "C" for less than 5,000. In such evaluations, "A" refers to excellent, "B" refers to good and "C" refers to inferior, meaning that a sample involving a larger number of "A"s or "B"s has more excellent cutting performance. The evaluation results are shown in Table 9.

TABLE 9

| Sample No. | Cutting test 1 | | | Cutting test 2 | |
|---|---|---|---|---|---|
| | Tool life (min) | Grade | Damage form | Tool life (shocks) | Grade |
| Invention sample 1 | 22 | A | Normal | 12,900 | A |
| Invention sample 2 | 22 | A | Normal wear | 10,400 | A |
| Invention sample 3 | 21 | A | Normal wear | 12,500 | A |
| Invention sample 4 | 24 | A | Normal wear | 14,600 | A |
| Invention sample 5 | 21 | A | Normal wear | 13,400 | A |
| Invention sample 6 | 23 | A | Normal wear | 11,000 | A |
| Invention sample 7 | 19 | B | Normal wear | 14,000 | A |
| Invention sample 8 | 15 | B | Normal wear | 12,800 | A |
| Invention sample 9 | 23 | A | Normal wear | 11,500 | A |
| Invention sample 10 | 15 | B | Normal wear | 13,000 | A |
| Invention sample 11 | 18 | B | Normal wear | 11,700 | A |
| Comparative sample 1 | 16 | B | Fracturing | 6,800 | B |
| Comparative sample 2 | 9 | C | Fracturing | 9,700 | B |
| Comparative sample 3 | 13 | C | Normal wear | 7,500 | B |
| Comparative sample 4 | 14 | C | Fracturing | 7,100 | B |
| Comparative sample 5 | 16 | B | Fracturing | 9,200 | B |
| Comparative sample 6 | 11 | C | Fracturing | 4,100 | C |
| Comparative sample 7 | 7 | C | Normal wear | 9,400 | B |
| Comparative sample 8 | 9 | C | Normal wear | 4,400 | C |
| Comparative sample 9 | 6 | C | Fracturing | 3,000 | C |

The results of Table 9 show that each invention sample had grade "B" or higher in the wear test and also show that each invention sample had grade "A" in the fracture test. Meanwhile, as to the evaluations on the comparative samples, each comparative sample had grade "C" in either or both of the wear test and the fracture test. Accordingly, it is apparent that the wear resistance and fracture resistance of each invention sample is more excellent than that of each comparative sample.

It is apparent from the above results that each invention sample has excellent wear resistance and fracture resistance, thereby resulting in a longer tool life.

The present application is based on the Japanese patent application filed on Apr. 21, 2017 (JP Appl. 2017-084073), the content of which is incorporated herein by reference.

INDUSTRIAL APPLICABILITY

As to a coated cutting tool according to the present invention, such coated cutting tool does not involve a reduction in wear resistance and has excellent wear resistance and fracture resistance, so that the tool life can be extended more than that involved in the prior art, and, from such perspective, the coated cutting tool has industrial applicability.

REFERENCE SIGNS LIST

1: Substrate, 2: Lowermost layer, 3: Titanium carbonitride layer, 4: Intermediate layer, 5: α-type aluminum oxide layer, 6: Outermost layer, 7: Coating layer, 8: Coated cutting tool, 9: First interface, 10: Second interface, 11: Intersecting edge.

What is claimed is:

1. A coated cutting tool comprising a substrate and a coating layer formed on a surface of the substrate, the coated cutting tool having a rake surface and a flank, in which the coating layer includes an α-type aluminum oxide layer, wherein:
  the α-type aluminum oxide layer has, on an opposite side to the substrate, a first interface, being the rake surface or a surface substantially parallel to the rake surface, a second interface, being the flank or a surface substantially parallel to the flank, and an intersecting edge between the first interface and the second interface;
  the α-type aluminum oxide layer satisfies conditions represented by formulae (A), (B) and (C)

$$-600 \leq \sigma 11 \leq 300 \tag{A}$$

$$-900 \leq \sigma 22 \leq 250 \tag{B}$$

$$\sigma 11 > \sigma 22 \tag{C}$$

(In the above formulae, σ11 denotes a residual stress value (unit: MPa) in a direction parallel to the intersecting edge, σ22 denotes a residual stress value (unit: MPa) in a direction orthogonal to the intersecting edge, and each of the residual stress values is a value measured by a multi-axial stress measurement method or a full Debye ring fitting method); and
  each of the residual stress values is a value measured, in the α-type aluminum oxide layer, at a position 50 μm from the intersecting edge along the first surface.

2. The coated cutting tool according to claim 1, wherein σ11 is from −600 MPa or higher to 0 MPa or lower and σ22 is from −900 MPa or higher to −100 MPa or lower.

3. The coated cutting tool according to claim 1, wherein, in the α-type aluminum oxide layer, a texture coefficient TC (0,0,12) of a (0,0,12) plane represented by formula (1) below is from 4.0 or more to 8.4 or less $$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

(In formula (1), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on a JCPDS Card No. 10-0173 for α-type aluminum oxide, and (h,k,l) refers to nine crystal planes of (0,1,2), (1,0,4), (1,1,0), (1,1,3), (1,1,6), (0,1,8), (2,1,4), (3,0,0) and (0,0,12)).

4. The coated cutting tool according to claim 1, wherein the α-type aluminum oxide layer satisfies a condition represented by formula (D) below

σ11−σ22>100      (D).

5. The coated cutting tool according to claim 1, wherein an average thickness of the α-type aluminum oxide layer is from 1.0 μm or more to 15.0 μm or less.

6. The coated cutting tool according to claim 1, wherein:
the coating layer comprises a titanium carbonitride layer, being comprised of titanium carbonitride, between the substrate and the α-type aluminum oxide layer; and
an average thickness of the titanium carbonitride layer is from 1.0 μm or more to 20.0 μm or less.

7. The coated cutting tool according to claim 6, wherein the coating layer comprises, between the titanium carbonitride layer and the α-type aluminum oxide layer, an intermediate layer comprising a compound of at least one kind selected from the group consisting of a Ti carboxide, a Ti oxynitride and a Ti carboxynitride.

8. The coated cutting tool according to claim 7, wherein an average thickness of the intermediate layer is from 0.1 μm or more to 1.5 μm or less.

9. The coated cutting tool according to claim 1, wherein an average thickness of the coating layer is from 3.0 μm or more to 30.0 μm or less.

10. The coated cutting tool according to claim 1, wherein the coating layer comprises a titanium nitride layer, being comprised of titanium nitride, as an outermost layer on a surface of the α-type aluminum oxide layer.

11. The coated cutting tool according to claim 1, wherein the substrate is any of a cemented carbide, cermet, ceramics and a sintered body containing cubic boron nitride.

12. The coated cutting tool according to any claim 2, wherein, in the α-type aluminum oxide layer, a texture coefficient TC (0,0,12) of a (0,0,12) plane represented by formula (1) below is from 4.0 or more to 8.4 or less $$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

(In formula (1), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on a JCPDS Card No. 10-0173 for α-type aluminum oxide, and (h,k,l) refers to nine crystal planes of (0,1,2), (1,0,4), (1,1,0), (1,1,3), (1,1,6), (0,1,8), (2,1,4), (3,0,0) and (0,0,12)).

13. The coated cutting tool according to claim 2, wherein the α-type aluminum oxide layer satisfies a condition represented by formula (D) below

σ11−σ22>100      (D).

14. The coated cutting tool according to claim 3, wherein the α-type aluminum oxide layer satisfies a condition represented by formula (D) below

σ11−σ22>100      (D).

15. The coated cutting tool according to claim 2, wherein an average thickness of the α-type aluminum oxide layer is from 1.0 μm or more to 15.0 μm or less.

\* \* \* \* \*